(12) United States Patent
Hsu et al.

(10) Patent No.: US 9,966,514 B2
(45) Date of Patent: May 8, 2018

(54) LIGHT EMITTING DIODE PACKAGE STRUCTURE AND FABRICATION METHOD

(71) Applicant: XIAMEN SANAN OPTOELECTRONICS TECHNOLOGY CO., LTD., Xiamen (CN)

(72) Inventors: Chen-Ke Hsu, Xiamen (CN); Junpeng Shi, Xiamen (CN); Pei-Song Cai, Xiamen (CN); Zhenduan Lin, Xiamen (CN); Hao Huang, Xiamen (CN); Chenjie Liao, Xiamen (CN); Chih-Wei Chao, Xiamen (CN); Qiuxia Lin, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days. days.

(21) Appl. No.: 15/192,993

(22) Filed: Jun. 24, 2016

(65) Prior Publication Data
US 2017/0005245 A1    Jan. 5, 2017

(30) Foreign Application Priority Data

Jul. 2, 2015   (CN) .......................... 2015 1 0380628
Aug. 20, 2015  (CN) .......................... 2015 1 0513557

(51) Int. Cl.
*H01L 33/60*    (2010.01)
*H01L 33/50*    (2010.01)
(Continued)

(52) U.S. Cl.
CPC ............ *H01L 33/60* (2013.01); *H01L 33/505* (2013.01); *H01L 33/507* (2013.01);
(Continued)

(58) Field of Classification Search
CPC ....... H01L 23/12; H01L 23/145; H01L 23/15; H01L 23/18; H01L 23/24; H01L 23/28;
(Continued)

(56) References Cited

U.S. PATENT DOCUMENTS 8,029,152 B2 * 10/2011 Sekine .................... H01L 33/60
                                                          362/297
9,343,443 B2 *  5/2016 Tischler ................ H01L 25/165
(Continued)

*Primary Examiner* — Scott B Geyer
(74) *Attorney, Agent, or Firm* — Syncoda LLC; Feng Ma; Junjie Feng

(57) ABSTRACT

A light emitting diode package structure allows for an improved light-emitting efficiency by including a first reflecting material layer with through holes; a flip chip on the first reflecting material layer, with the electrodes inlaid in the through holes of the first reflecting material layer; a first transparent material layer surrounding the side surface of the flip chip except the electrodes; and a second reflecting material layer surrounding the first transparent material layer. An interface between the first transparent material layer and the reflecting material layer is an inclined plane, an arc plane, or an irregular shape, to thereby facilitate upward light reflection of the flip chip. A wavelength conversion material layer is over the first reflecting material layer, the flip chip, and the second reflecting material layer.

17 Claims, 26 Drawing Sheets

(51) Int. Cl.
*H01L 33/54* (2010.01)
*H01L 33/62* (2010.01)

(52) U.S. Cl.
CPC ............ *H01L 33/508* (2013.01); *H01L 33/54* (2013.01); *H01L 33/62* (2013.01); *H01L 2933/0016* (2013.01); *H01L 2933/0033* (2013.01); *H01L 2933/0058* (2013.01); *H01L 2933/0066* (2013.01)

(58) Field of Classification Search
CPC ....... H01L 24/81; H01L 33/48; H01L 33/483; H01L 33/486; H01L 33/50; H01L 33/505; H01L 33/507; H01L 33/52; H01L 33/54; H01L 33/56; H01L 33/58; H01L 33/60; H01L 33/46; H01L 33/405
See application file for complete search history.

(56) References Cited

U.S. PATENT DOCUMENTS

| | | | | |
|---|---|---|---|---|
| 2006/0157722 A1* | 7/2006 | Takezawa | ............... | H01L 33/60 257/98 |
| 2007/0278513 A1* | 12/2007 | Chikugawa | ............. | H01L 33/54 257/100 |
| 2011/0057226 A1* | 3/2011 | Oberleither | ........... | H01L 33/505 257/98 |
| 2015/0221830 A1* | 8/2015 | Kim | ...................... | H01L 33/486 257/98 |
| 2016/0043285 A1* | 2/2016 | Basin | .................. | H01L 25/0753 257/98 |

* cited by examiner

LIGHT EMITTING DIODE PACKAGE STRUCTURE AND FABRICATION METHOD

CROSS-REFERENCE TO RELATED APPLICATIONS

The present application is a continuation of and claims priority to Chinese Patent Application Nos. CN 201510380628.3 filed on Jul. 2, 2015, and CN 201510513557.X filed on Aug. 20, 2015. The disclosures of these applications are hereby incorporated by reference in their entirety.

BACKGROUND

Light Emitting Diode (LED) is a semiconductor light-emitting device fabricated by adopting P-N junction electro-luminescence principle. Advantaged at environmental protection, high luminance, low power consumption, long service life, low working voltage and easy integration, the LED is the fourth-generation new light source following incandescent lamp, fluorescent lamp and high intensity discharge lamp (HID).

Conventional LED package structure is made through die bond, bonding wire and fluorescent glue packaging on a metal support. In recent years, flip-chip scale package becomes popular as it requires neither substrate nor bonding wire where fluorescent glue is directly covered on the chip before cutting. With large radiant angle, this package is applicable for LED bulbs. However, large radiant angle is disadvantaged in other applications like spotlight and back light.

In Chinese patent CN101872817, a light emitting diode package structure with a glue wall is provided, comprising a light emitting diode chip and a glue wall on a ceramic substrate, and packaging glue covering the light emitting diode chip and the glue wall. In this structure, the glue wall is in an enclosed and circular shape to surround yet not contact with the light emitting diode chip. The glue wall is higher than the light emitting diode chip. Packaging glue made of transparent material is filled in the space between the light emitting diode chip and the glue wall. The package glue top has a convex surface for light condensing, and the convex surface edge aligns with the glue wall top. In this patent, the light emitting angle can be decided by the relative height difference and horizontal distance between the light emitting diode chip and the glue wall and no convex lens are additionally required, thus simplifying the entire package structure and improving reliability in actual operation. However, this method is disadvantaged in that: (1) the package structure needs to be installed on a large-size ceramic substrate, which prevents it from integration; (2) the vertical glue wall is not good for upward light emitting and affects light extraction efficiency.

SUMMARY

The present disclosure provides a light emitting diode package structure to overcome the defects of the prior art where advantages of the bowl-shape cup in conventional SMD package are combined. This present disclosure is low-cost and has reduced thermal resistance as it requires no substrate structure. In addition, it provides simple optical design at application end with a radiant angle similar to Lambert light emitting and delivers high lighting effect.

According to a first aspect of the present disclosure, a light emitting diode package structure is provided, comprising: a first reflecting material layer with through holes; a flip chip on the first reflecting material layer, with the electrodes inlaid in the through holes of the first reflecting material layer; a first transparent material layer surrounding the side surface of the flip chip except the electrodes; a second reflecting material layer surrounding the first transparent material layer, the interface between the first transparent material layer and the reflecting material layer is an inclined plane, or an arc plane or an irregular shape, which is good for upward light reflection of the flip chip; and a wavelength conversion material layer covered over the above structure.

In some embodiments, the upper surface of the second reflecting material layer is flush with the upper surfaces of the first transparent material layer and the flip chip, and makes the aforesaid upper surfaces into a co-plane.

In some embodiments, the wavelength conversion material layer is on the co-plane.

In some embodiments, the inner edge of the second reflecting material layer bottom contacts with the side surface of the flip chip.

In some embodiments, the inner edge of the second reflecting material layer bottom has certain gap from the side surface of the flip chip.

In some embodiments, the first transparent material layer contains no wavelength conversion material.

In some embodiments, the first transparent material layer contains wavelength conversion material.

In some embodiments, the interface between the first transparent material layer and the second reflecting material layer is an inclined plane, or an arc plane or an irregular shape.

In some embodiments, an optical reflecting layer is inserted at the interface between the first transparent material layer and the second reflecting material layer.

In some embodiments, the upper surface of the wavelength conversion material layer is a 5 μm-200 μm thick plane.

In some embodiments, the upper surface of the wavelength conversion material layer is roughened.

In some embodiments, the upper surface of the wavelength conversion material layer has an arc structure.

In some embodiments, the wavelength conversion material layer has optical lens.

In some embodiments, a selective optical film is arranged on the co-plane so that the selective optical film is between the co-plane and the wavelength conversion material layer.

In some embodiments, the selective optical film is characterized in that: it has high transmittance for blue light and high reflectivity for green light, yellow light and red light.

In some embodiments, the flip chip electrodes contain Cu or Au and are about 1 μm-100 μm thick.

In some embodiments, a second transparent material layer is covered on the wavelength conversion material layer.

According to a second aspect of the present disclosure, a light emitting diode package structure is provided, comprising: a first reflecting material layer with through holes; an inverted-trapezoidal flip chip on the first reflecting material layer, with the electrodes inlaid in the through holes of the first reflecting material layer; a second reflecting material layer surrounding the inverted-trapezoidal flip chip, the interface between the second reflecting material layer and the flip chip forms an optical cup, which is good for upward light reflection of the flip chip; and a wavelength conversion material layer covered over the above structure.

According to a third aspect of the present disclosure, a fabrication method of light emitting diode package structure is provided, comprising: providing a fluorescent film.

Bonding a plurality of flip chips to the fluorescent film where the flip chip electrodes are far away from the fluorescent film; forming a transparent material layer on the fluorescent film surrounding the side surface of the flip chip except the electrodes, in which, the side surface of the transparent material layer between adjacent flip chips is in U shape or V shape; filling a first reflecting material layer on the flip chip and the transparent material layer; grinding or blasting the first reflecting material layer till the flip chip electrodes are exposed so that the upper surface of the first reflecting material layer is not higher than the upper surface of the flip chip electrodes; and forming a plurality of units by cutting along the central line of adjacent flip chips to obtain a light emitting diode package structure.

In some embodiments, at least one surface of the fluorescent film is adhesive and the bonding surface with the flip chip is adhesive.

In some embodiments, the transparent material layer is formed through dispensing, printing, hot pressing or their combination.

In some embodiments, the U-shape or V-shape side surface of the transparent material layer is cut by a blade with an inclined angle at front edge.

In some embodiments, the U-shape or V-shape side surface of the transparent material layer is formed through the surface tension of the transparent material layer surrounding the side surface of the flip chip.

In some embodiments, the upper surface of the first reflecting material layer is flush with the upper surface of the flip chip electrodes.

In some embodiments, the first reflecting material layer is filled through hot pressing.

According to a fourth aspect of the present disclosure, a fabrication method of light emitting diode package structure is provided, comprising: providing a first reflecting material layer and fabricating through holes on the first reflecting material layer; bonding a plurality of flip chips on the first reflecting material layer to make the flip chip electrodes inlaid in the through holes of the first reflecting material layer; covering a latticed photo-etched metal sheet on the flip chip where the photo-etched metal sheet has a hole-opening structure along the central line direction of adjacent flip chips;

filling a second reflecting material layer on the hole-opening structure to enable the side surface of the second reflecting material layer in a trapezoid or a bowl shape;

removing the photo-etched metal sheet and filling a transparent material layer in the gap between the flip chip and the second reflecting material layer so that the upper surface of the transparent material layer is flush with the upper surface of the flip chip; covering a fluorescent film on the upper surfaces of the transparent material layer and the flip chip; and forming a plurality of units by cutting along the central line of adjacent flip chips to obtain a light emitting diode package structure.

In some embodiments, the second reflecting material layer is filled through hot pressing.

In some embodiments, the photo-etched metal sheet is a steel mesh.

Compared with conventional SMD package, the light emitting diode package structure of the present disclosure at least has the following technical effects: (1) with no substrate structure, the fabrication cost is cut and the package structure size can be flexibly changed; (2) the wavelength conversion material layer with even thickness makes the color dot output more concentrated; and (3) the package body has low thermal resistance.

Compared with existing chip-scale package technology, the present disclosure at least has the following technical effects below: (1) the light emitting surface is approximate to a Lambert light emitting surface where the light emitting angle can be controlled at about 120°, which can be used in display system back light and spotlight; (2) the reflecting material layer in an inclined plane, or an arc plane or an irregular shape is good for upward light reflection of the flip chip and has high lighting effect; and (3) the organic material is filled between the flip chip electrodes and the electrodes are thick, which, to some extent, can release the stress from the PCB board on the chips when the application end is used.

The other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
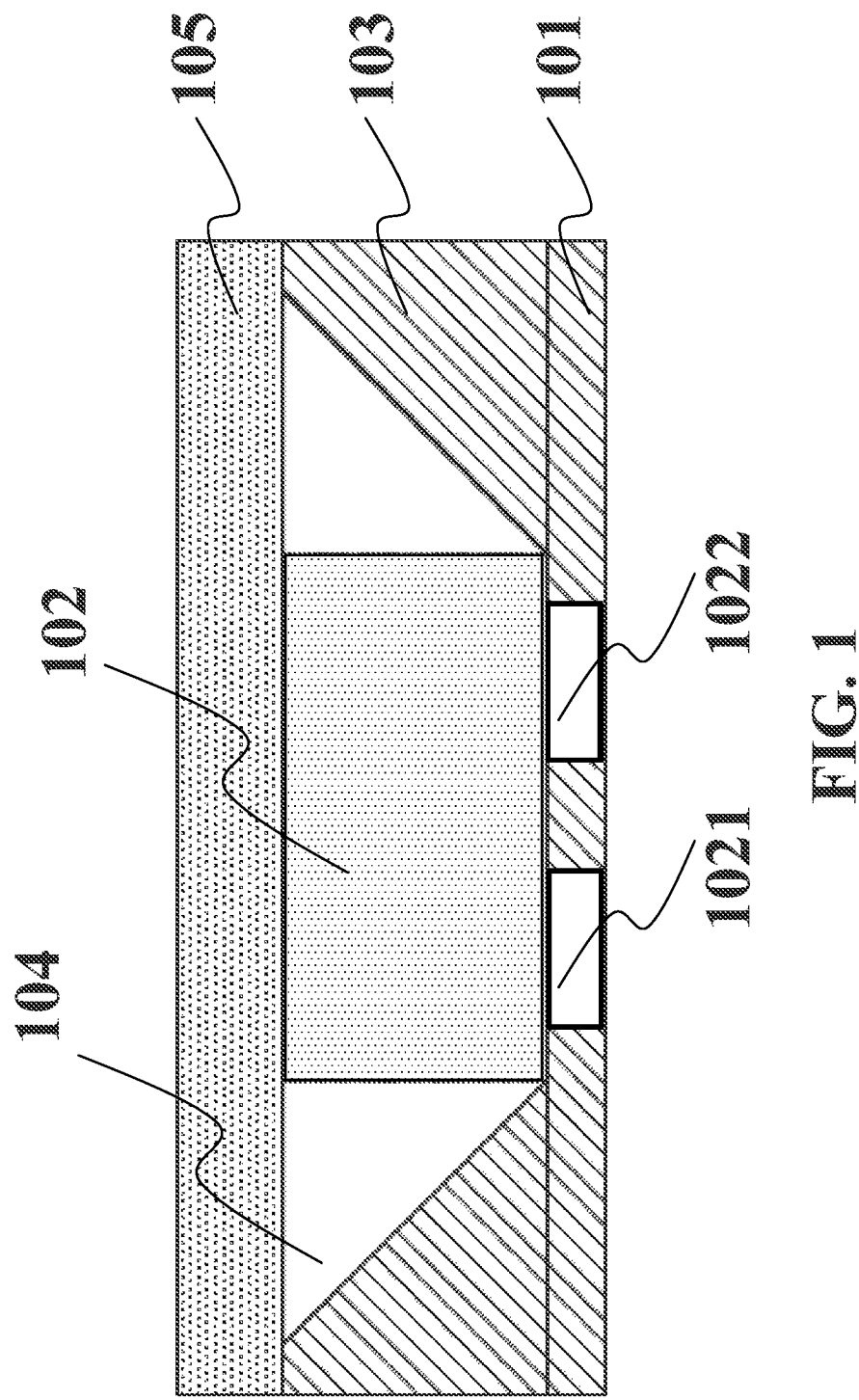
FIG. 1 is a cross-section view of the light emitting diode package structure of Embodiment 1.

In the drawings: 101: first reflecting material layer; 102: flip chip; 1021, 1022: electrodes; 103: second reflecting material layer; 104: first transparent material layer; 105: wavelength conversion material layer; 106: second transparent material layer; 107: selective optical film; 108: optical lens; 109: optical reflecting layer; 201: fluorescent film; 202: flip chip; 2021, 2022: electrodes; 203: transparent material layer; 204: first reflecting material layer; 2041, 2042: through hole; 205: photo-etched metal sheet; 2051: hole-opening structure; 206: second reflecting material layer.

DETAILED DESCRIPTION

The LED package structure and fabrication method thereof will be described in detail with reference to the accompanying drawings.

Embodiment 1

As shown in FIG. 1, this embodiment provides a light emitting diode package structure, comprising a flip chip 102, a first reflecting material layer 101, a second reflecting material layer 103, a first transparent material layer 104 and a wavelength conversion material layer 105.

Wherein, the flip chip 102 is on the first reflecting material layer 101 with through holes, and the electrodes 1021 and 1022 of the flip chip 102 are inlaid in the through holes of the first reflecting material layer 101, that means, the side surface of the electrodes or part of the side surface is surrounded by the first reflecting material layer 101, wherein the positive and negative electrodes (1021 and 1022) of the flip chip 102 contain either Cu or Au and are about 10 µm-100 µm thick. The first reflecting material layer 101 and the thick electrodes, to some extent, can release the stress from the PCB on the flip chip when the application end is used. The first reflecting material layer is thinner than the electrodes, and its bottom surface can be lower than, be flush with, or higher than the chip electrode bottom, but the thickness difference cannot be more than 10 µm. The first transparent material layer 104 surrounds the side surface of the flip chip except the electrodes; the second reflecting material layer 103 on the first reflecting material layer 101 surrounds the first transparent material layer 104, and forms a bowl shape with a wide-top and narrow-bottom opening; and the interface layer with the first transparent material layer 104 is an inclined plane, which improves light extraction efficiency as the light emitted from the chip will be reflected to the inside of the wavelength conversion material layer 105 through the interface layer.

In addition, the inner edge of the second reflecting material layer 103 bottom contacts with the side surface of the flip chip 102, making the light emitting surface of the package structure narrowed when the inclination angle of the interface between the second reflecting material layer/first transparent layer remains unchanged, which is good for further design of optical lens.

In addition, the upper surfaces of the flip chip 102 and the second reflecting material layer 103 are flush with the upper surface of the first transparent material layer 104 and make the aforesaid upper surfaces into a co-plane. The upper and bottom surfaces of the wavelength conversion material layer 105 are 5 µm-200 µm planes, which cover on the flip chip 102, the first transparent material layer 104 and the second reflecting material layer 103, and at least entirely cover the upper surfaces of the flip chip 102 and the first transparent material layer 104. As the upper and bottom surfaces of the wavelength conversion material layer 105 are planes with even thickness, the color dot concentration ratio of the package structure is high. In addition, this package structure has low thermal resistance as the chip electrodes are directly exposed without using substrate or die bonding glue.

Embodiment 2

Figure 2:
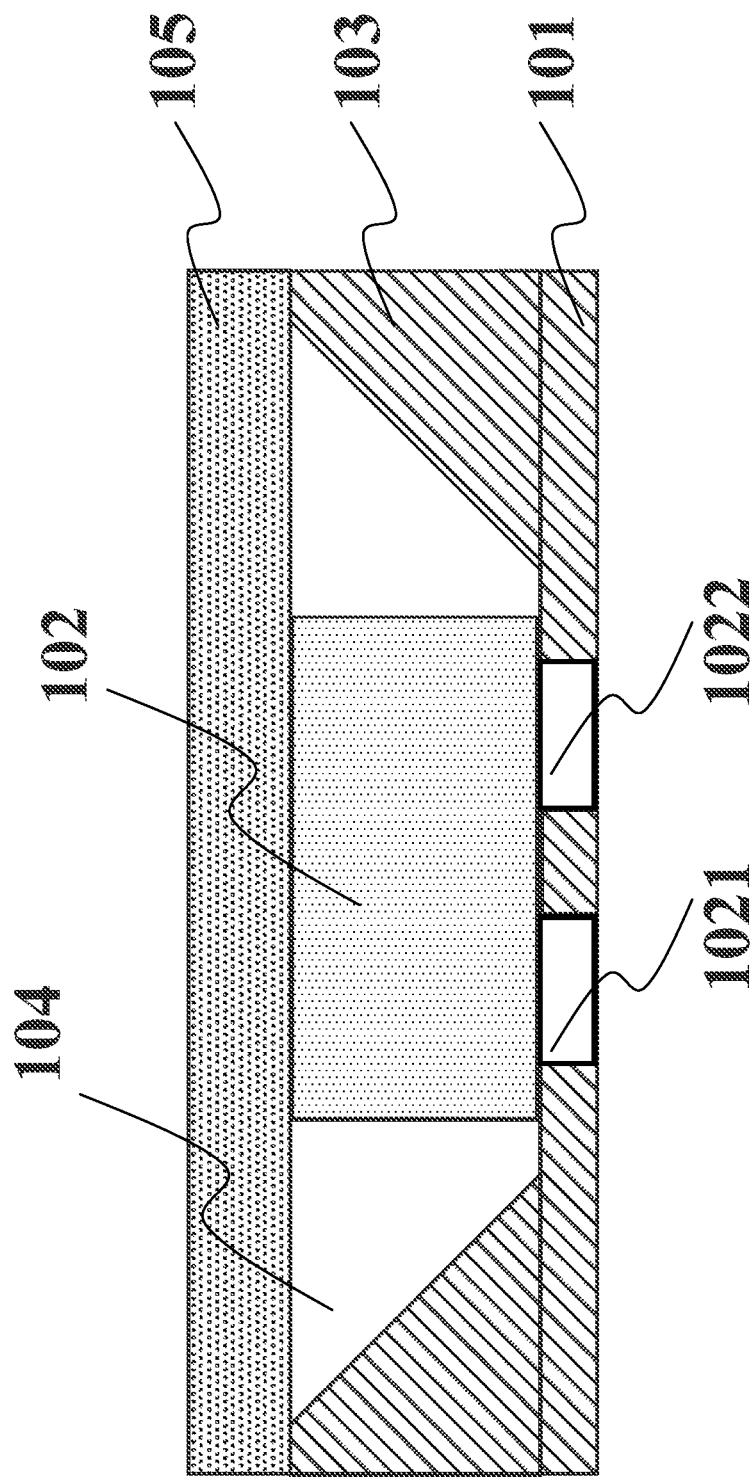
FIG. 2 is a cross-section view of the light emitting diode package structure of Embodiment 2.

As shown in FIG. 2, compared with Embodiment 1, the inner edge of the second reflecting material layer 103 bottom has certain gap from the side surface of the flip chip 102, thus increasing light emitting area and improving lighting effect to some extent without changing the flip chip size.

Embodiment 3

Figure 3:
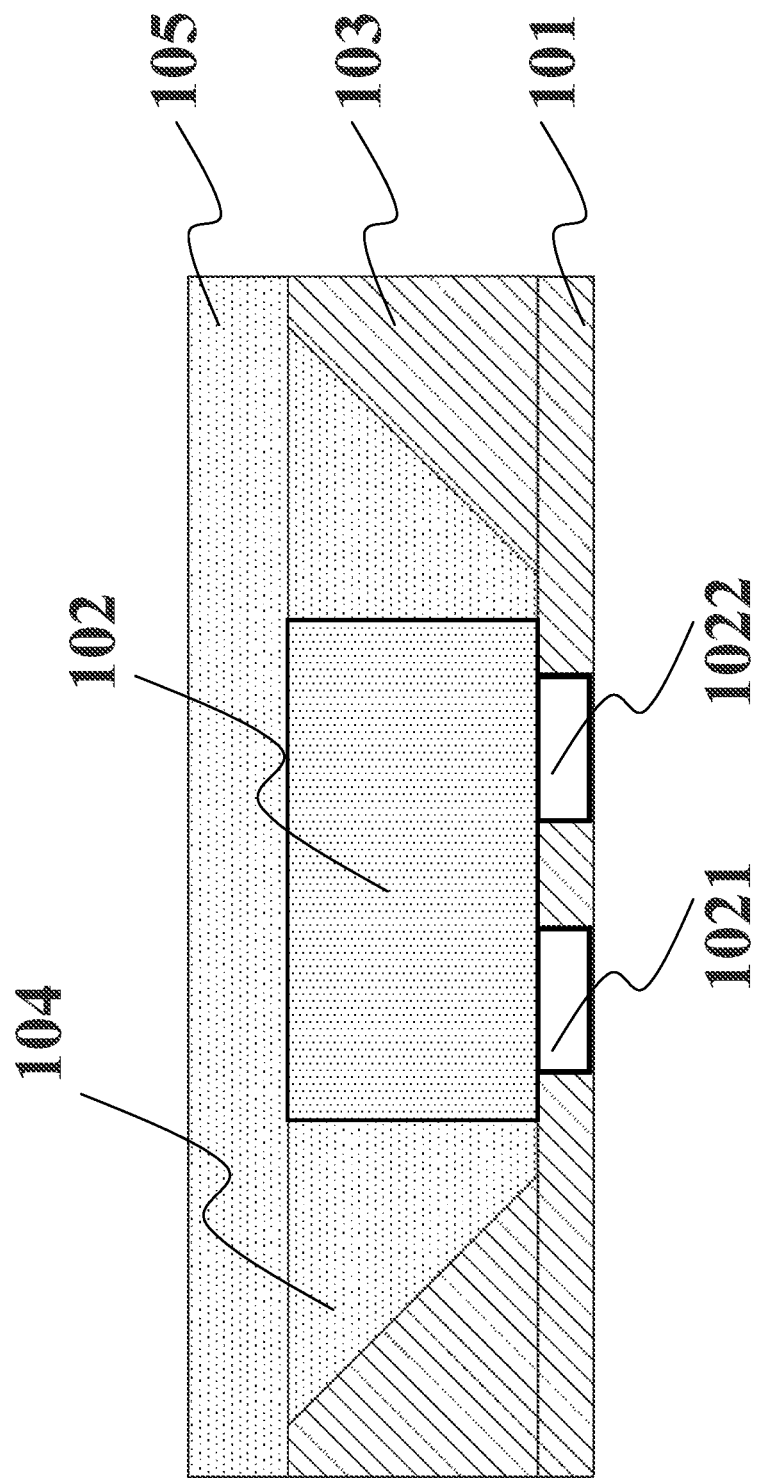
FIG. 3 is a cross-section view of the light emitting diode package structure of Embodiment 3.

As shown in FIG. 3, compared with Embodiment 1, the first transparent material layer 104 contains wavelength conversion material. For example, add red light conversion material in the first transparent material layer and add only yellow light or green light conversion material in the wavelength conversion material layer 105 to avoid second absorption of yellow light or green light by the red light conversion material, thus improving lighting effect effectively.

Embodiment 4

Figure 4:
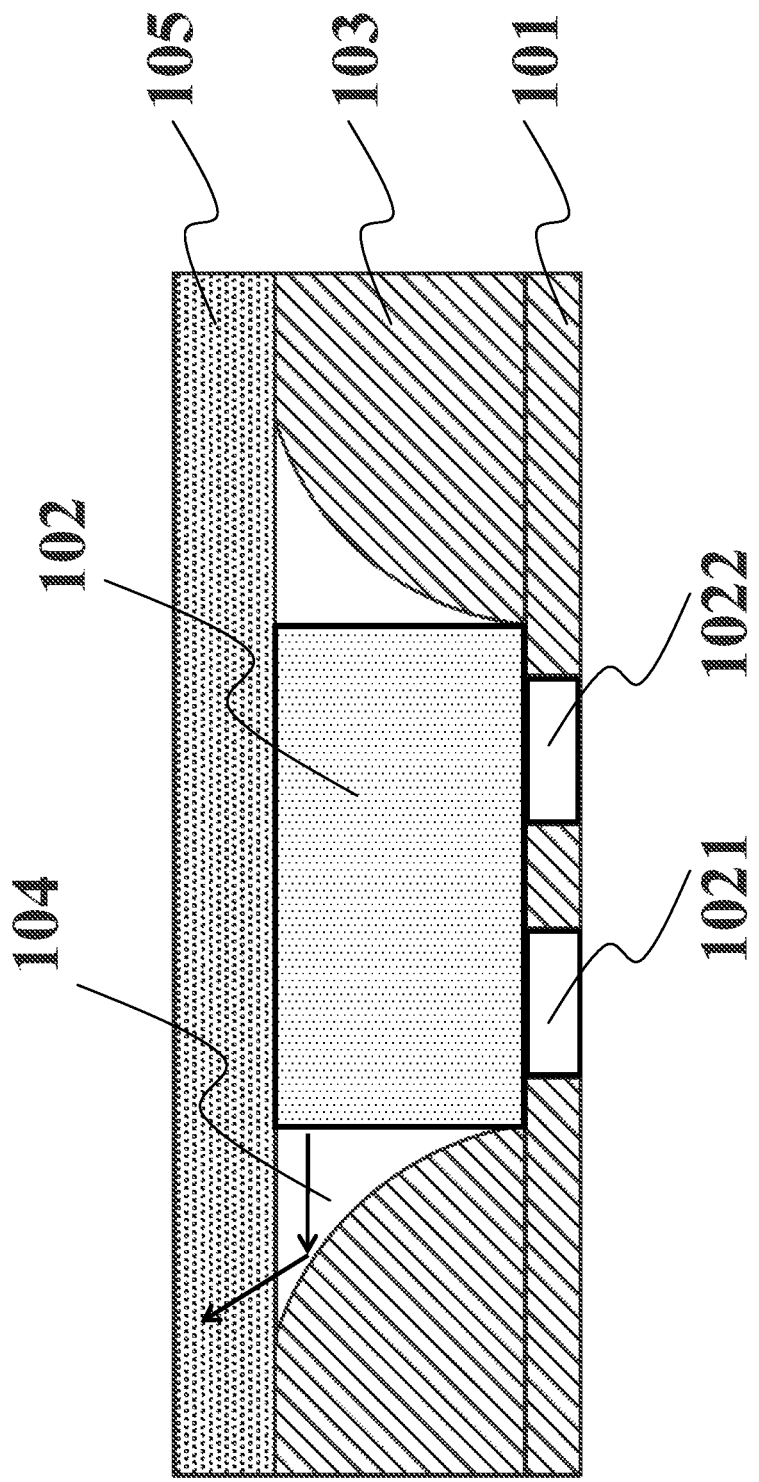
FIG. 4 is a cross-section view of the light emitting diode package structure of Embodiment 4.

As shown in FIG. 4, compared with Embodiment 1, in this embodiment, the interface between the first transparent material layer 104 and the second reflecting material layer 103 is a convex arc surface, where the light from the chip, after reflection by the interface layer, is emitted to the wavelength conversion layer at an upward and relatively outward direction, which is good for improving the luminance and color uniformity of the entire luminous surface and at different angles.

Embodiment 5

Figure 5:
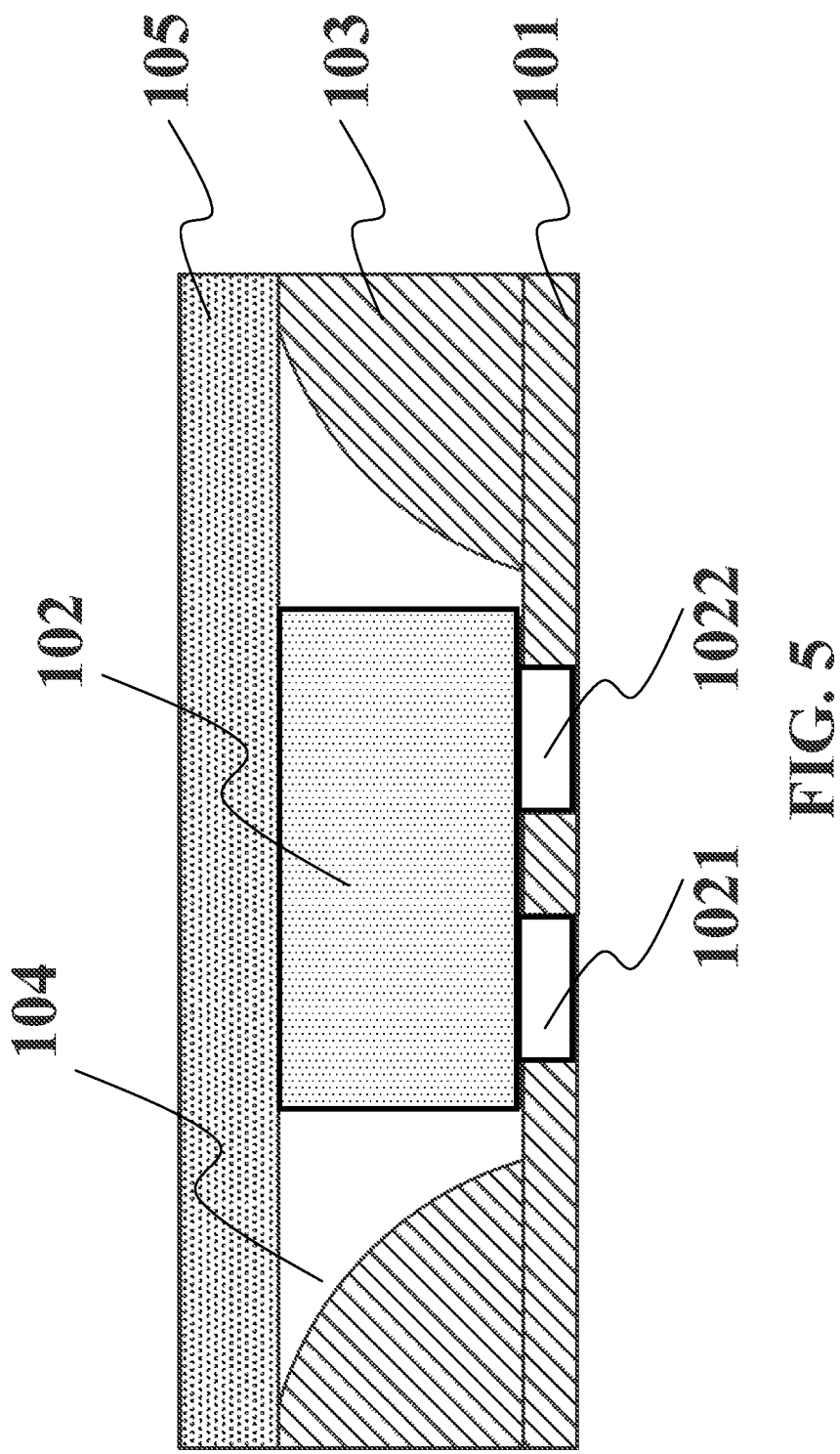
FIG. 5 is a cross-section view of the light emitting diode package structure of Embodiment 5.

As shown in FIG. 5, compared with Embodiment 4, in this embodiment: the inner edge of the second reflecting material layer 103 bottom has certain gap from the side surface of the flip chip 102, the purpose of which is same as that in Embodiment 2.

Embodiment 6

Figure 6:
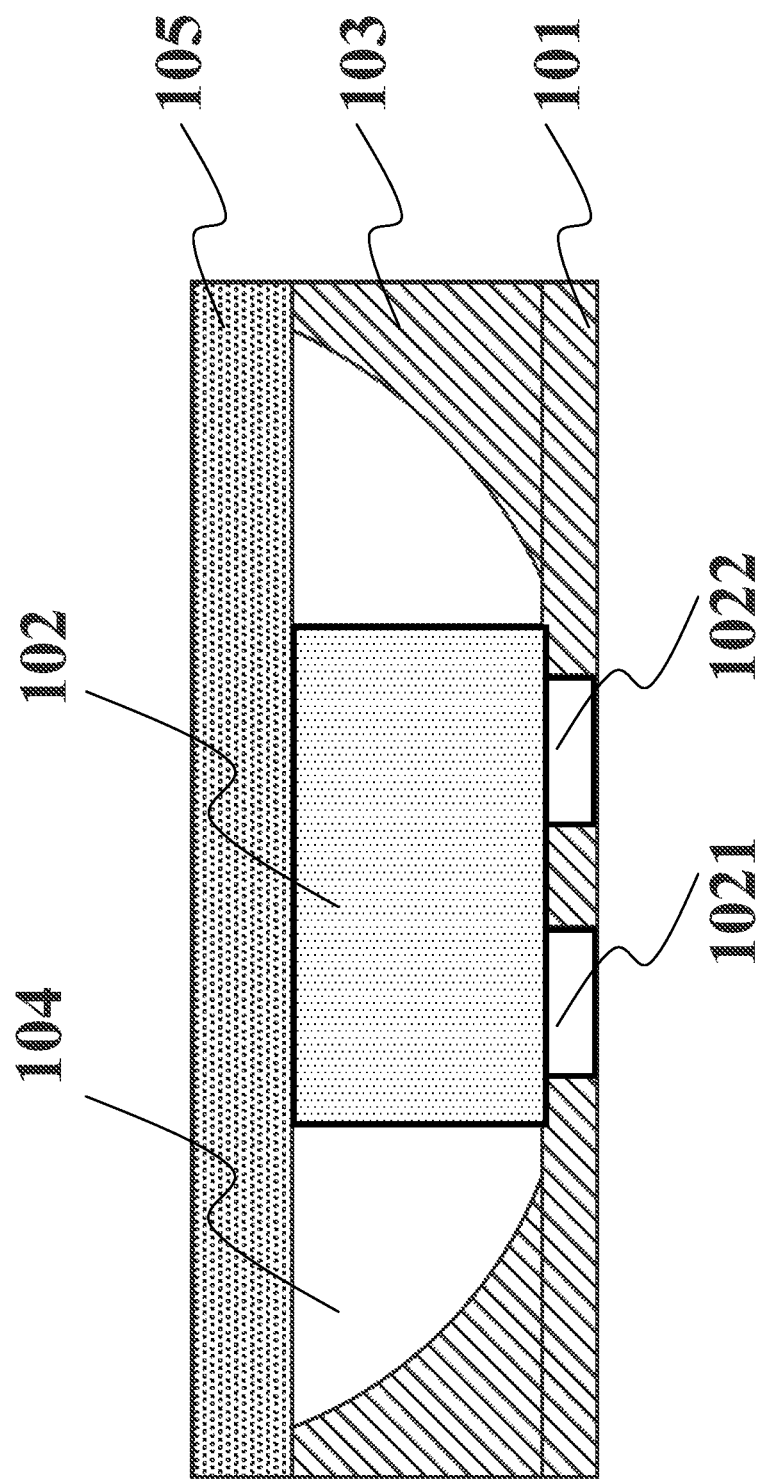
FIG. 6 is a cross-section view of the light emitting diode package structure of Embodiment 6.

As shown in FIG. 6, compared with Embodiment 1, in this embodiment, the interface between the first transparent material layer 104 and the second reflecting material layer 103 is a concave arc surface, which is good for further increasing light emitting.

Embodiment 7

Figure 7:
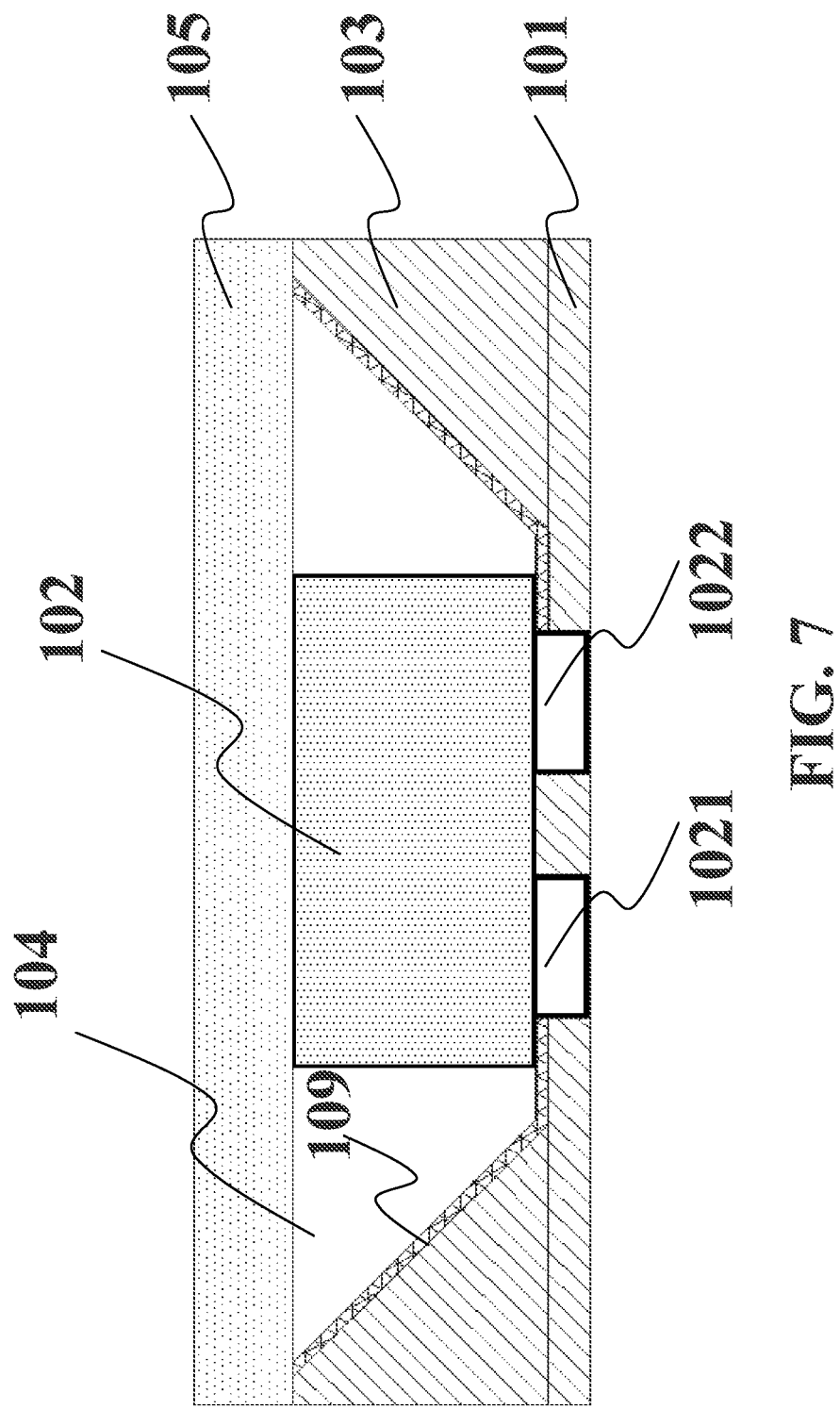
FIG. 7 is a cross-section view of the light emitting diode package structure of Embodiment 7.

As shown in FIG. 7, compared with Embodiment 1, in this embodiment, an optical reflecting layer 109 (e.g., Ag metal reflecting layer or DBR) is inserted at the interface between the first transparent material layer 104 and the second reflecting material layer 103, with reflectivity higher than that of the second reflecting material layer 103, which is good further increasing light emitting.

Embodiment 8

Figure 8:
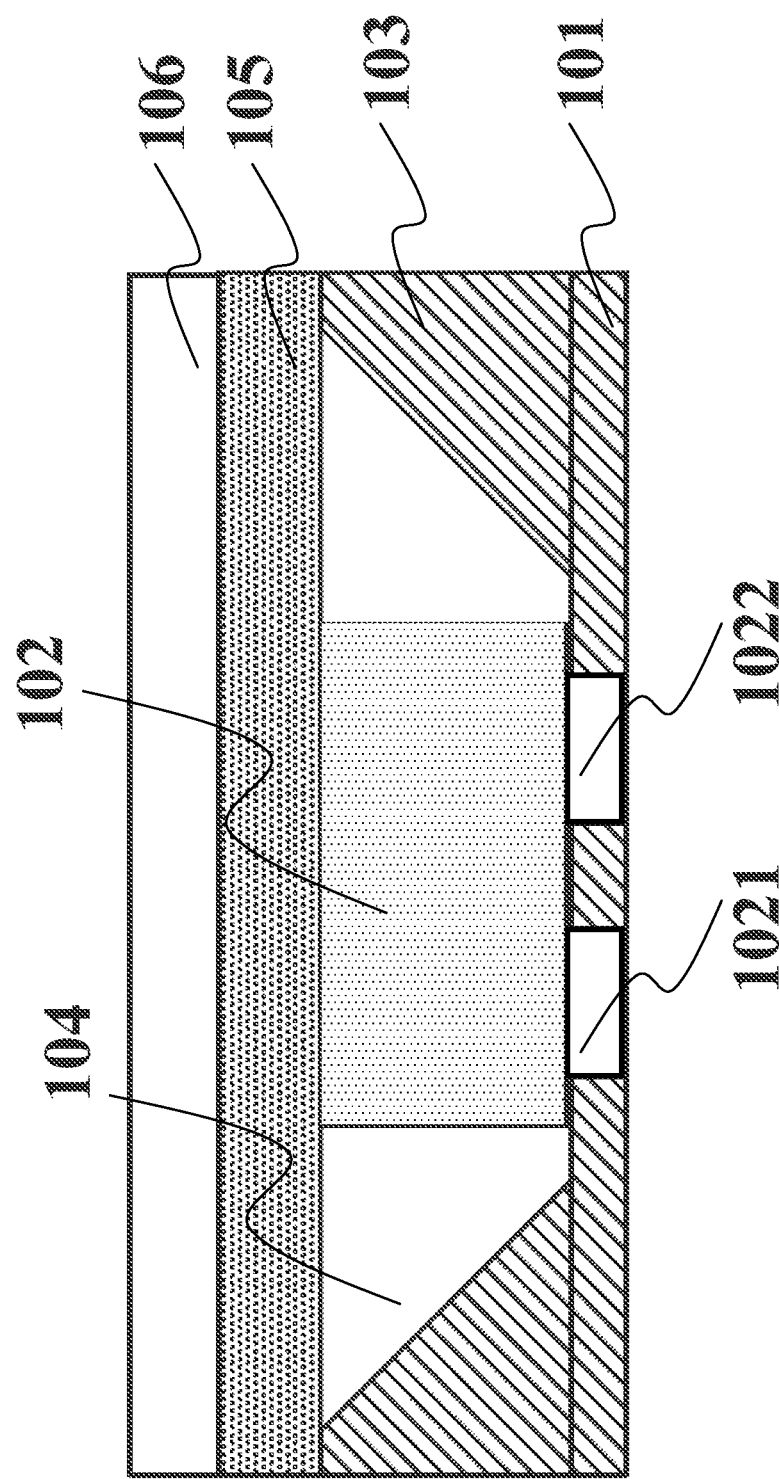
FIG. 8 is a cross-section view of the light emitting diode package structure of Embodiment 8.

As shown in FIG. 8, compared with Embodiment 1, in this embodiment, a second transparent material layer 106 is covered on the wavelength conversion material layer, which effectively protects the wavelength conversion material layer from being polluted and damaged.

Embodiment 9

Figure 9:
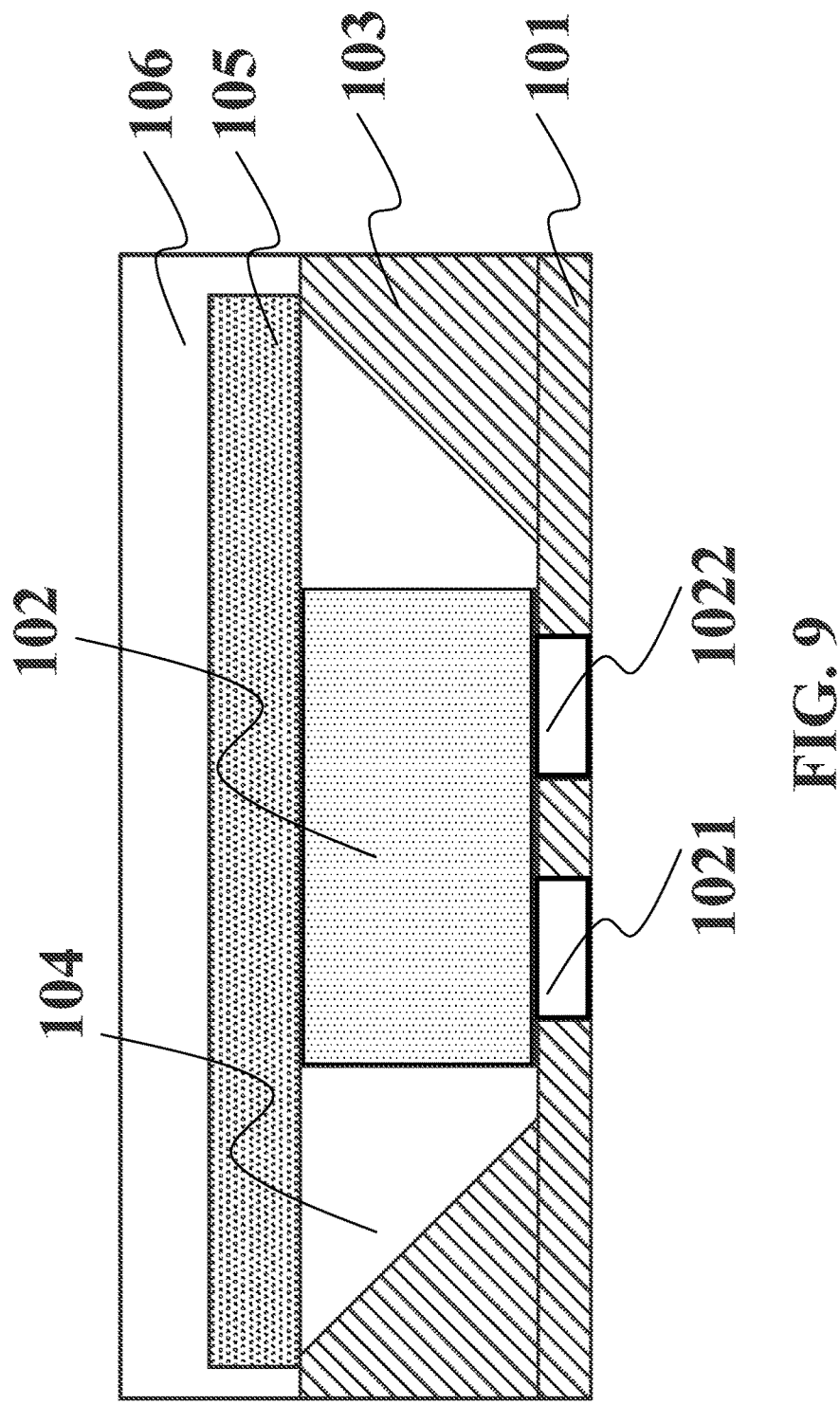
FIG. 9 is a cross-section view of the light emitting diode package structure of Embodiment 9.

As shown in FIG. 9, compared with Embodiment 1, in this embodiment: a second transparent material layer 106 wraps on the wavelength conversion material layer 105, with technical effect same as that in Embodiment 8.

Embodiment 10

Figure 10:
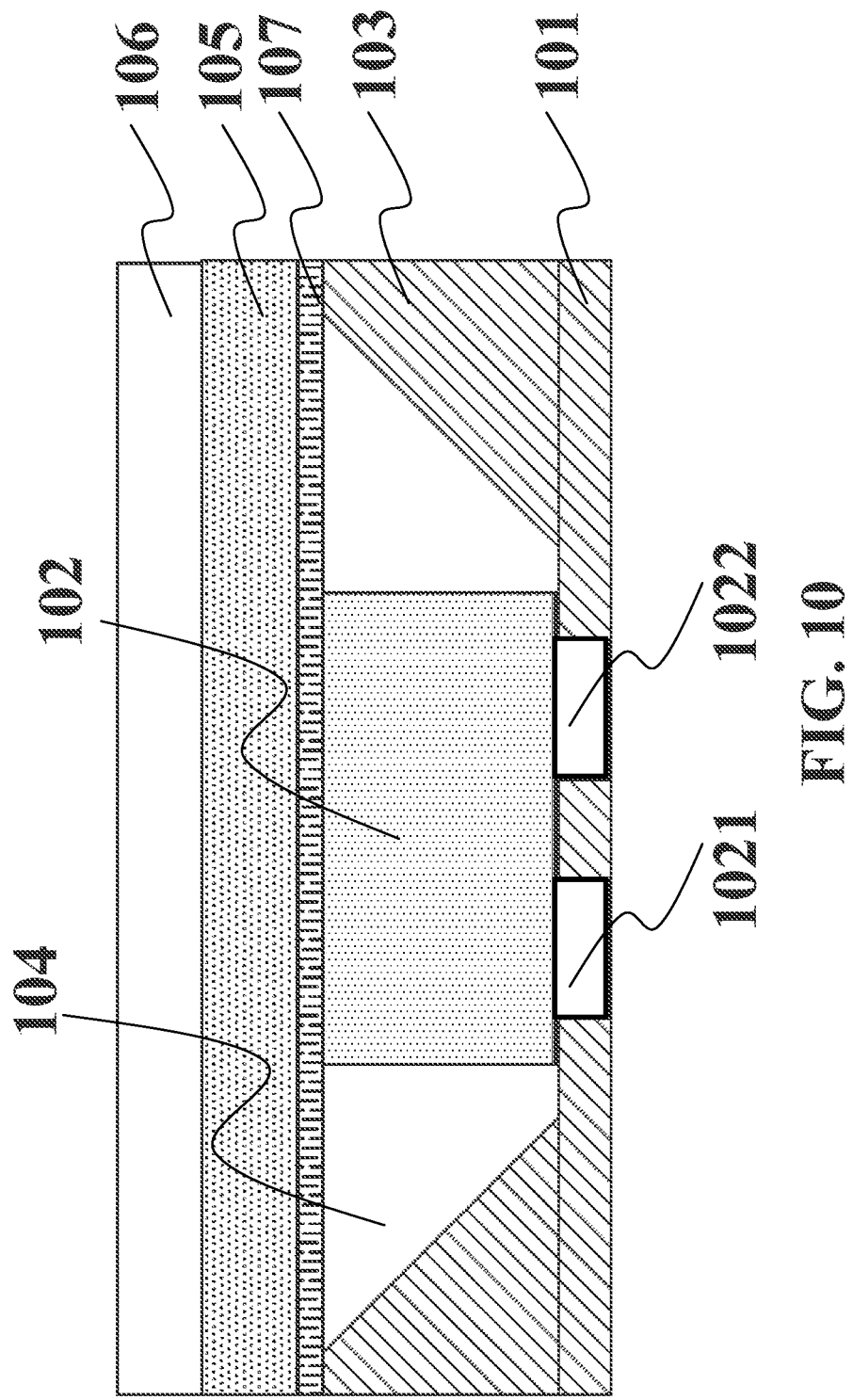
FIG. 10 is a cross-section view of the light emitting diode package structure of Embodiment 10.

As shown in FIG. 10, compared with Embodiment 1, in this embodiment: a selective optical film 107 is arranged on the co-plane so that the selective optical film 107 is between the co-plane and the wavelength conversion material layer 105, in which, the selective optical film is characterized in that: it has high transmittance for blue light and high reflectivity for green light, yellow light and red light.

Embodiment 11

Figure 11:
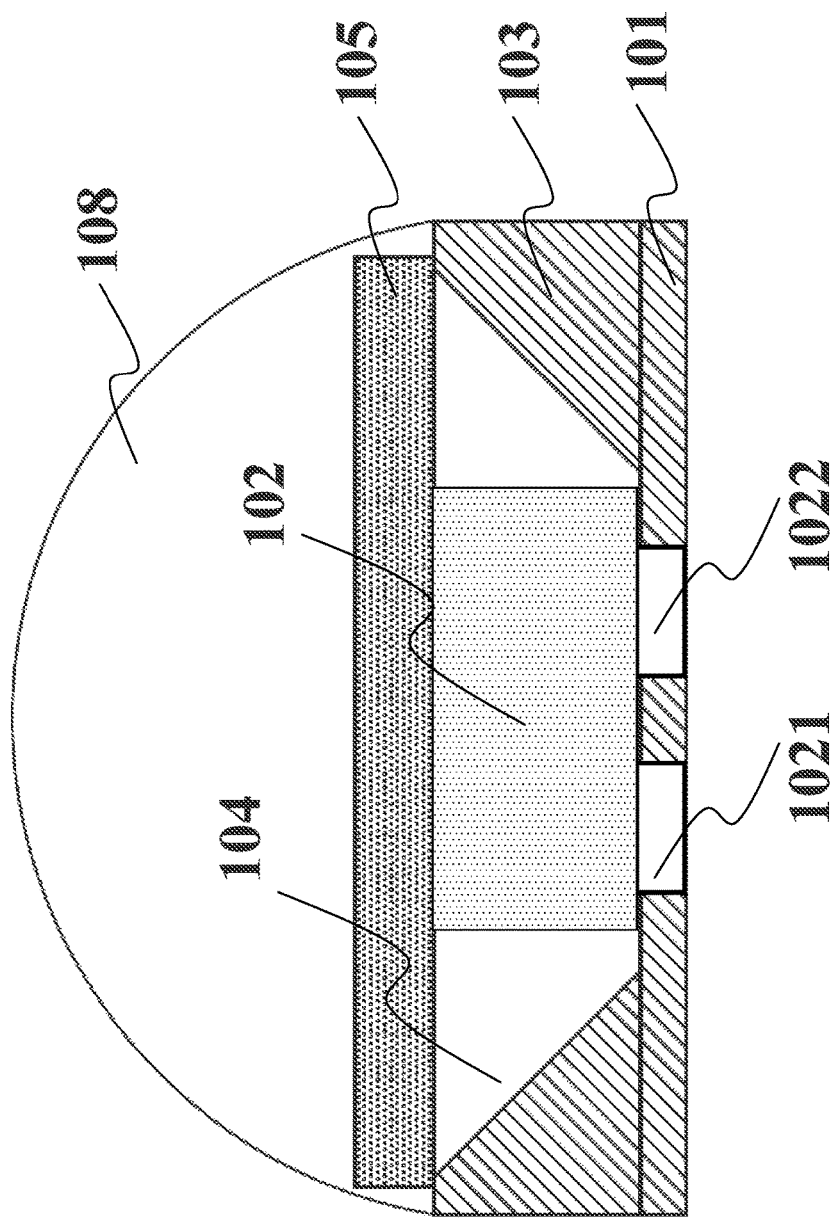
FIG. 11 is a cross-section view of the light emitting diode package structure of Embodiment 11.

As shown in FIG. 11, compared with Embodiment 1, in this embodiment, an arc-structure optical lens 108 is arranged on the wavelength conversion material layer 105.

Embodiment 12

Figure 12:
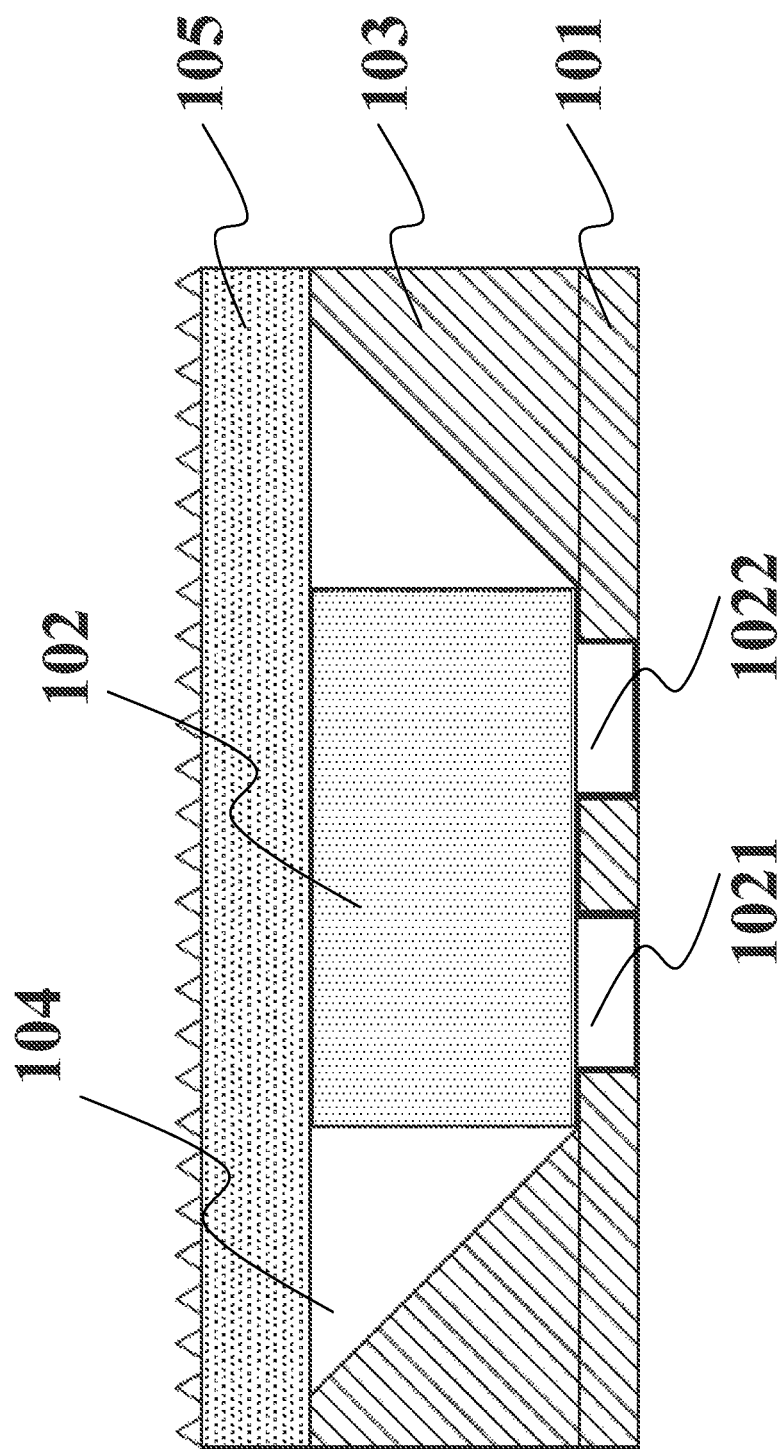
FIG. 12 is a cross-section view of the light emitting diode package structure of Embodiment 12.

As shown in FIG. 12, compared with Embodiment 1, in this embodiment, the upper surface of the wavelength conversion material layer 105 is roughened to further improve light extraction and lighting effect.

Embodiment 13

Figure 13:
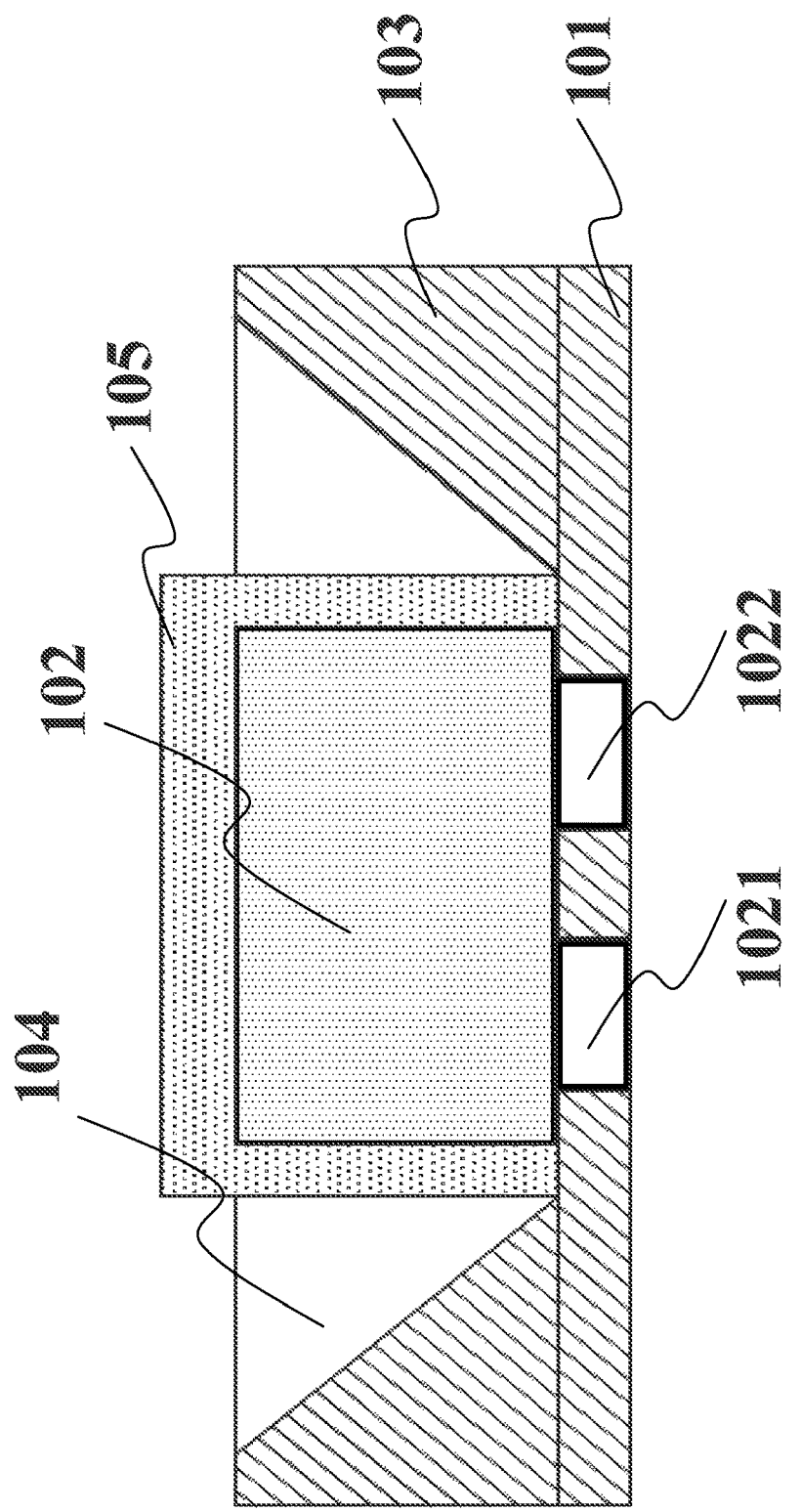
FIG. 13 is a cross-section view of the light emitting diode package structure of Embodiment 13.

As shown in FIG. 13, compared with Embodiment 1, in this embodiment, the wavelength conversion material layer 105 covers above the flip chip 102, and to be specific, the wavelength conversion material layer 105 entirely wraps over the flip chip 102 yet does not cover till the upper surface of the first transparent material layer 104. The first transparent material layer 104 surrounds part of the side surface of the wavelength conversion material layer or wraps the external surface of the entire wavelength conversion material layer. As the contact surface between the wavelength conversion material layer and the chip is larger than that in Embodiment 1, it is good for transmitting the heat out of the wavelength conversion material layer through the chip, thus reducing surface temperature during usage and improving reliability.

Embodiment 14

Figure 14:
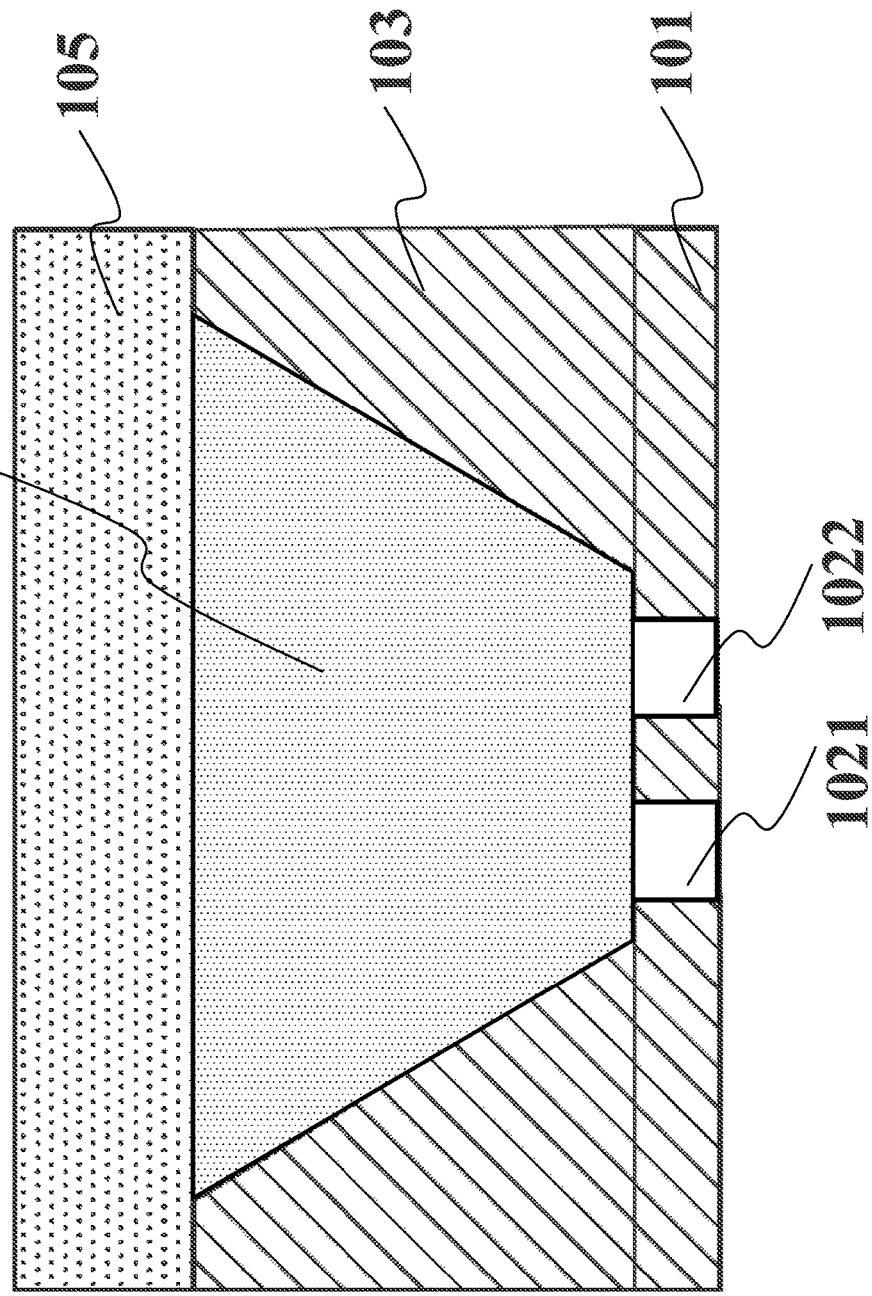
FIG. 14 is a cross-section view of the light emitting diode package structure of Embodiment 14.

As shown in FIG. 14, compared with Embodiment 1, in this embodiment, the flip chip 102 is in an inverted-trapezoidal shape and the first transparent material layer is omitted, thus cutting package cost, increasing output concentration ratio and simplifying fabrication process; in addition, the second reflecting material layer 103 directly surrounds the inverted-trapezoidal flip chip 102, the interface layer between the second reflecting material layer 103 and the flip chip 102 forms an optical cup, which is good for upward light reflection of the flip chip and increases light emitting.

Embodiment 15

FIGS. 15-19 are process flow diagrams for fabricating a light emitting diode package structure of Embodiment 15.

Figure 15:
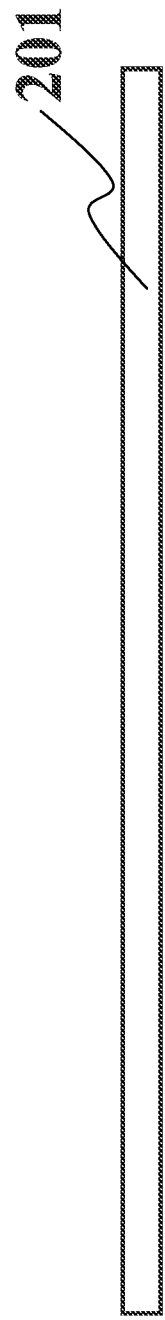
FIG. 15 illustrates a first step of a process flow for fabricating a light emitting diode package structure of Embodiment 15.
Figure 16:
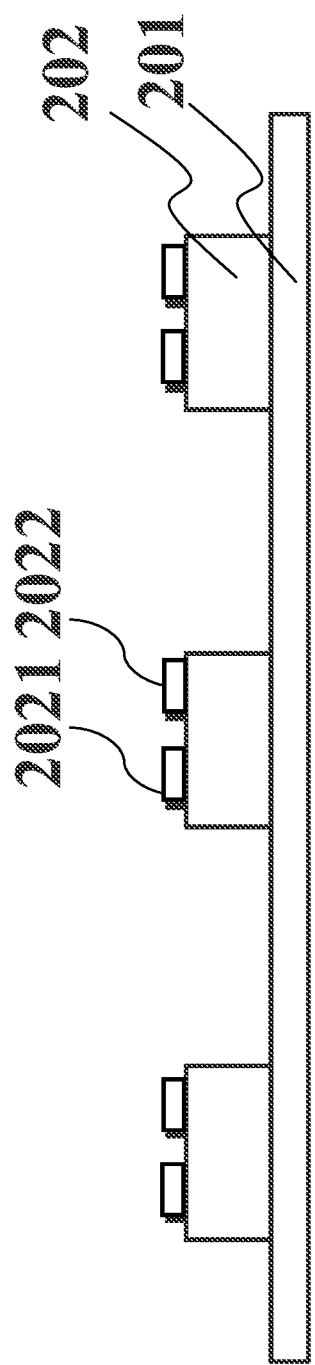
FIG. 16 illustrates a second step of a process flow for fabricating a light emitting diode package structure of Embodiment 15.
Figure 17:
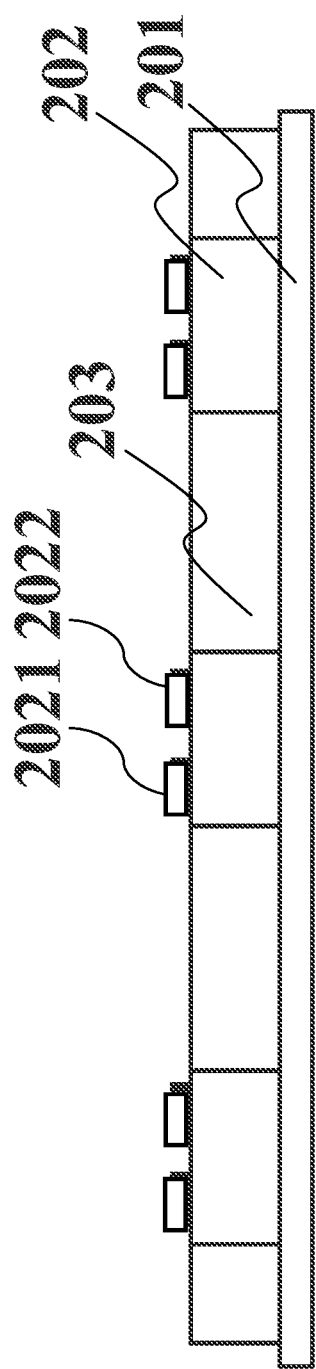
FIG. 17 illustrates a third step of a process flow for fabricating a light emitting diode package structure of Embodiment 15.
Figure 18:
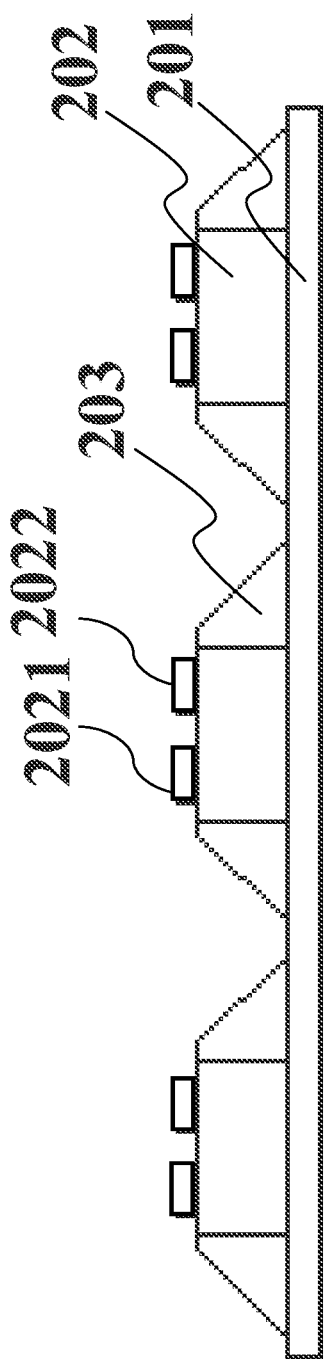
FIG. 18 illustrates a fourth step of a process flow for fabricating a light emitting diode package structure of Embodiment 15.

As shown in FIG. 15, provide a fluorescent film 201, in which, the upper surface is adhesive and the bottom surface is not;

As shown in 16, bond a plurality of flip chips 202 on the fluorescent film 201 to make the electrodes 2021 and 2022 of the flip chip far away from the fluorescent film, in which, the bonding surface between the fluorescent film 201 and the flip chip 202 is the adhesive surface;

As shown in FIG. 17, print a transparent material layer 203 on the fluorescent film 201 that surrounds the side surface of the flip chip except the electrodes;

As shown in FIG. 18, the side surface of the transparent material layer 203 between the adjacent flip chips is cut into a V shape through a blade with an inclined angle at front edge.

Figure 19:
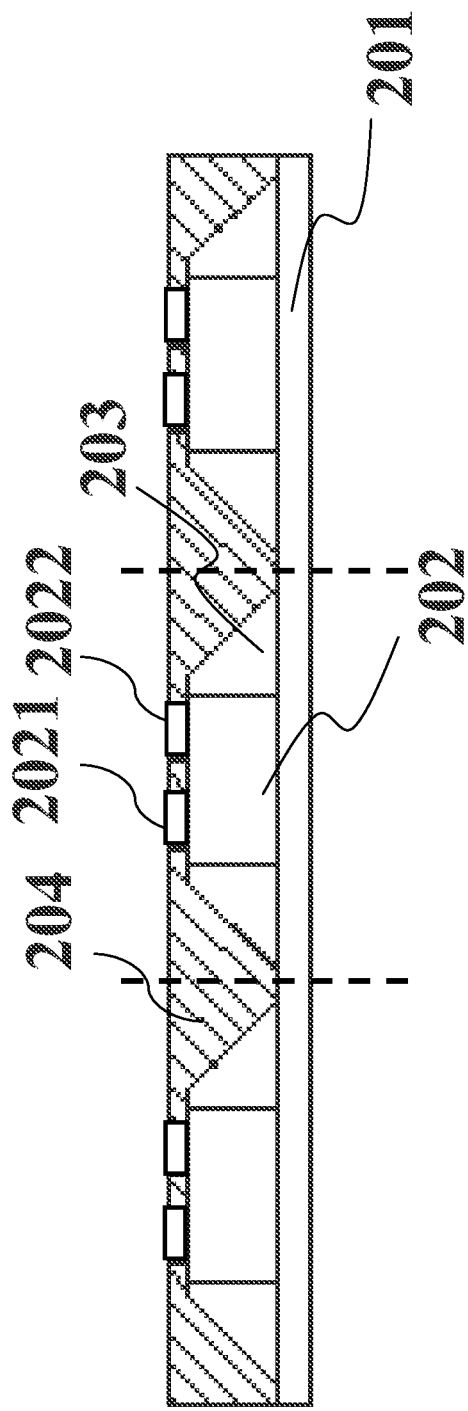
FIG. 19 illustrates a fifth step of a process flow for fabricating a light emitting diode package structure of Embodiment 15.

As shown in FIG. 19, fill a first reflecting material layer 204 on the flip chip 202 and the transparent material layer 203 through hot pressing; grind or blast the first reflecting material layer 204 till the flip chip electrodes 2021 and 2022 are exposed so that the upper surface of the first reflecting material layer is flush with the upper surface of the flip chip electrodes; and lastly, form a plurality of units by cutting along the central line of adjacent flip chips to obtain a light emitting diode package structure.

This embodiment effectively reduces thermal resistance and cuts cost as the chip electrodes are directly exposed without using substrate or die bonding glue; the first reflecting material layer is remained as a bowl-shape structure, which is good for upward light reflection of the flip chip and improves lighting effect.

Embodiment 16

FIGS. 20-26 are process flow diagrams for fabricating a light emitting diode package structure of Embodiment 16.

Figure 20:
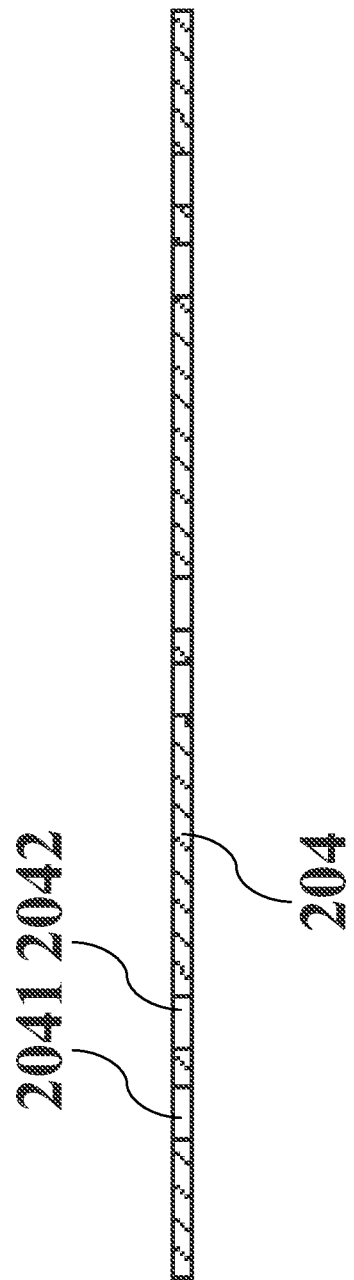
FIG. 20 illustrates a first step of a process flow diagrams fabricating a light emitting diode package structure of Embodiment 16.
Figure 21:
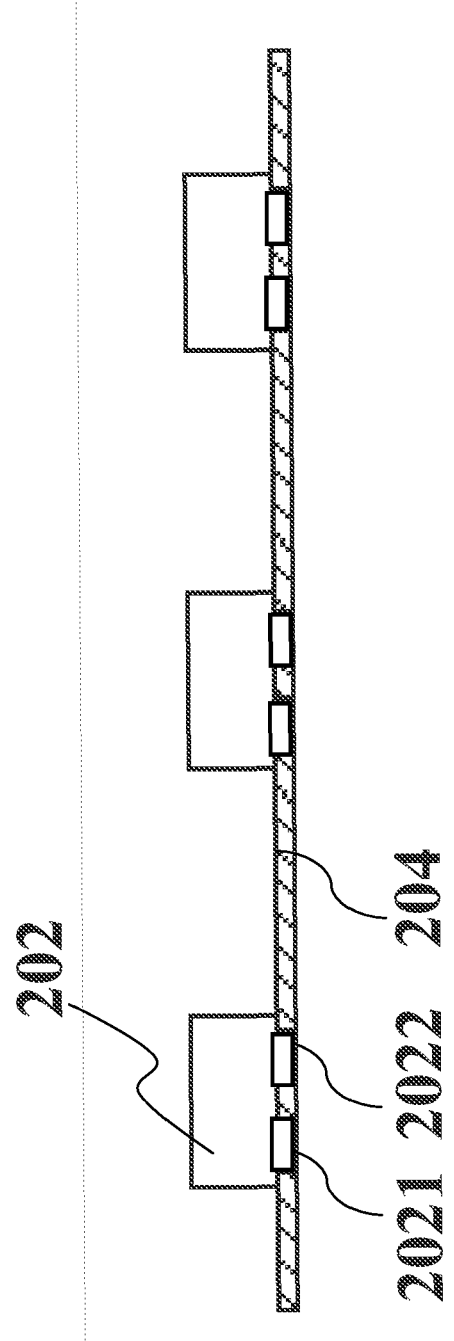
FIG. 21 illustrates a second step of a process flow diagrams fabricating a light emitting diode package structure of Embodiment 16.
Figure 22:
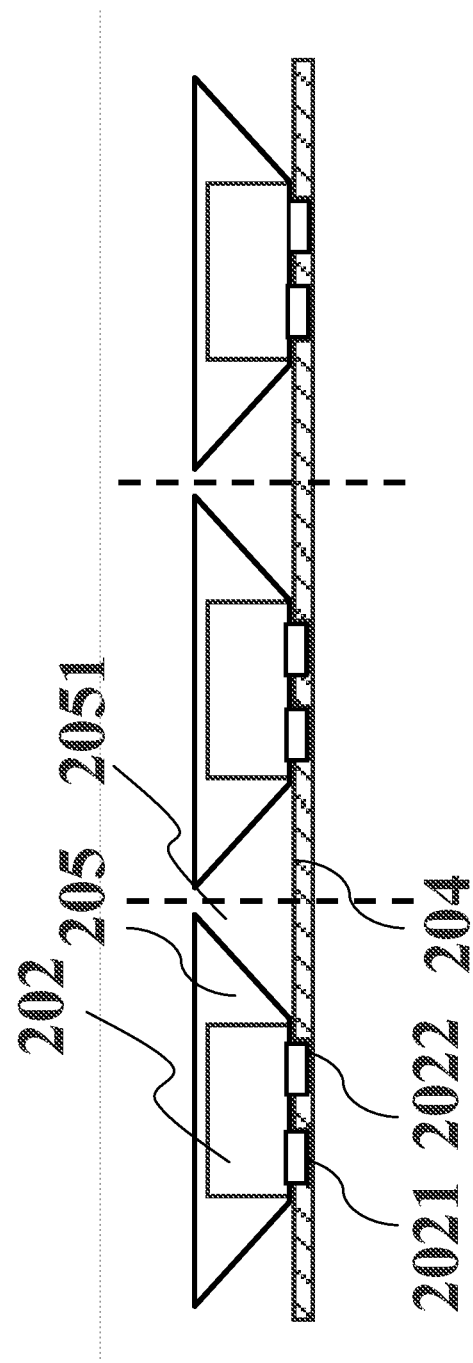
FIG. 22 illustrates a third step of a process flow diagrams fabricating a light emitting diode package structure of Embodiment 16.
Figure 23:
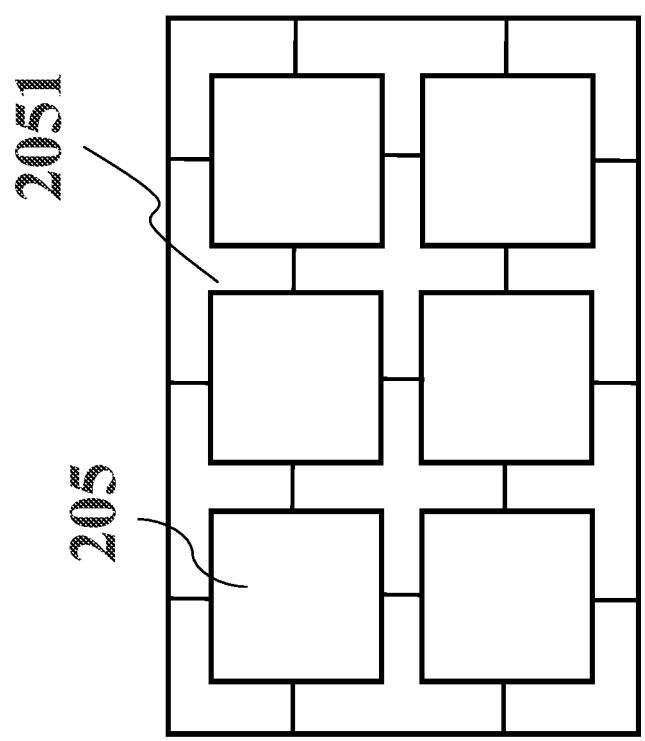
FIG. 23 is a top view of the photo-etched metal sheet in FIG. 22.
Figure 24:
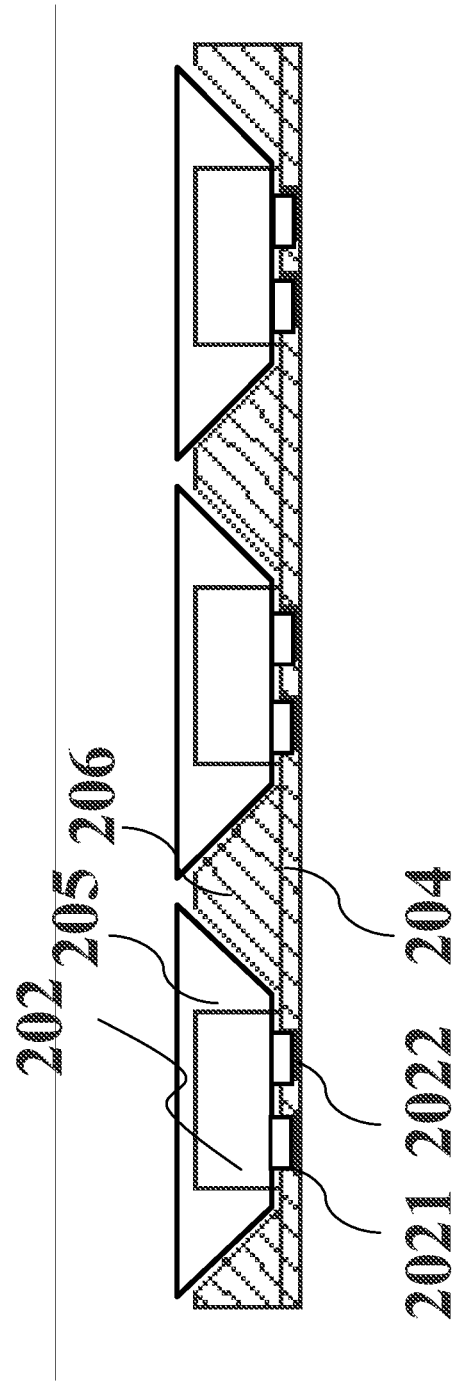
FIG. 24 illustrates a fourth step of a process flow diagrams fabricating a light emitting diode package structure of Embodiment 16.
Figure 25:
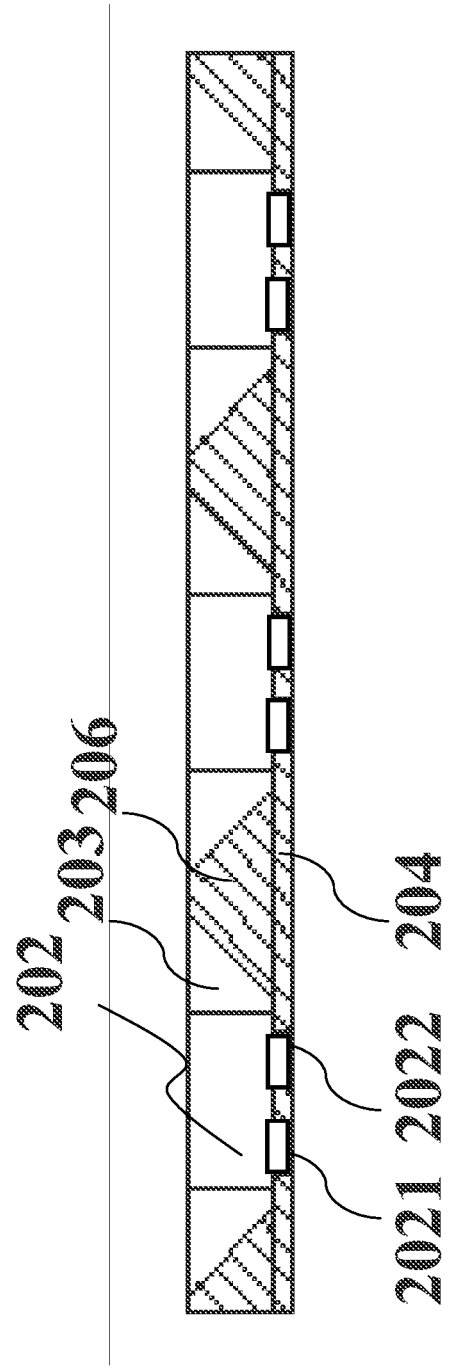
FIG. 25 illustrates a fifth step of a process flow diagrams fabricating a light emitting diode package structure of Embodiment 16.
Figure 26:
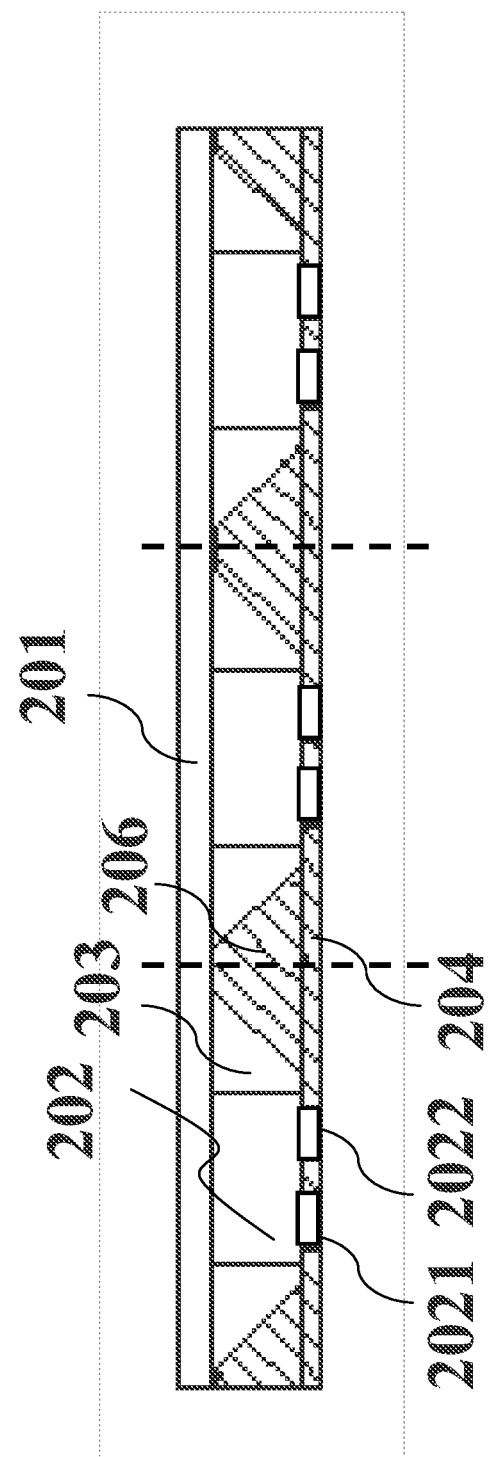
FIG. 26 illustrates a sixth step of a process flow diagrams fabricating a light emitting diode package structure of Embodiment 16.

As shown in FIG. 20, provide a first reflecting material layer 204 and fabricate through holes 2041 and 2042 on the first reflecting material layer, in which, the through hole sizes match with the sizes of the flip chip electrodes fabricated later;

As shown in FIG. 21, bond a plurality of flip chips 202 on the first reflecting material layer 204 to make the flip chip electrodes 2021 and 2022 inlaid in the through holes of the first reflecting material layer 204;

As shown in FIGS. 22 and 23, cover a latticed photo-etched metal sheet 205 on the flip chip 202 where the photo-etched metal sheet has a hole-opening structure 2051 along the central line direction of adjacent flip chips; in this embodiment, the photo-etched metal sheet is preferably a steel sheet;

As shown in FIG. 24, fill a second reflecting material layer 206 on the hole-opening structure with a hot pressing machine to enable the side surface of the second reflecting material layer in a trapezoid or a bowl shape; in this embodiment, trapezoid is preferable;

As shown in FIG. 25, remove the steel sheet and fill a transparent material layer 203 in the gap between the flip chip 202 and the second reflecting material layer 206 so that the upper surface of the transparent material layer 203 is flush with the upper surface of the flip chip 202;

As shown in FIG. 26, cover a fluorescent film 201 on the upper surfaces of the transparent material layer 203 and the flip chip 202 and lastly, form a plurality of units by cutting along the central line of adjacent flip chips to obtain a package structure.

This embodiment adopts no substrate to effectively reduce thermal resistance and cost; and the second reflecting material layer is remained as a bowl-shape structure, which is good for upward light reflection of the flip chip and improves lighting effect.

Embodiment 17

Different from Embodiment 15, in this embodiment, the side surface of the transparent material layer is in U shape, and this U-shape side surface is formed through the surface tension of the transparent material layer surrounding the side surface of the flip chip during dispensing.

It should be noted that the U-shape side surface of the transparent material layer can be adjusted and cured to a concave or a convex shape by controlling the liquidity of the liquid transparent material layer.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode package structure, comprising:
   a first reflecting material layer comprising a reflective glue with through holes;
   a flip chip over the first reflecting material layer, with electrodes inlaid in the through holes of the first reflecting material layer;
   a first transparent material layer comprising a transparent glue surrounding a side surface of the flip chip other than the electrodes;
   a second reflecting material layer comprising a reflective glue surrounding the first transparent material layer, wherein an interface between the first transparent material layer and the second reflecting material layer is an inclined plane, an arc plane, or an irregular shape, to thereby facilitate upward light reflection of the flip chip; and
   a wavelength conversion material layer comprising a fluorescent material.

2. The light emitting diode package structure of claim 1, wherein: an upper surface of the second reflecting material layer is flush with upper surfaces of the first transparent material layer and the flip chip, and makes the upper surfaces into a co-plane.

3. The light emitting diode package structure of claim 2, wherein: a selective optical film is arranged on the co-plane such that the selective optical film is between the co-plane and the wavelength conversion material layer.

4. The light emitting diode package structure of claim 3, wherein: the selective optical film is configured to transmit blue light and reflect green light, yellow light, and red light.

5. The light emitting diode package structure of claim 1, wherein: an inner edge of a bottom of the second reflecting material layer is in contact with a side surface of the flip chip.

6. The light emitting diode package structure of claim 1, wherein: an inner edge of a bottom of the second reflecting material layer has a gap from a side surface of the flip chip.

7. The light emitting diode package structure of claim 1, wherein: the first transparent material layer does not contain a wavelength conversion material.

8. The light emitting diode package structure of claim 1, wherein: the first transparent material layer contains a wavelength conversion material.

9. The light emitting diode package structure of claim 1, wherein: an interface between the first transparent material layer and the second reflecting material layer is an inclined plane, an arc plane, or an irregular shape.

10. The light emitting diode package structure of claim 1, wherein: an optical reflecting layer is inserted at an interface between the first transparent material layer and the second reflecting material layer.

11. The light emitting diode package structure of claim 1, wherein: the wavelength conversion material layer has a thickness of 5 μm-200 μm and a planar upper surface.

12. The light emitting diode package structure of claim 1, wherein: an upper surface of the wavelength conversion material layer is roughened.

13. The light emitting diode package structure of claim 1, wherein: an upper surface of the wavelength conversion material layer has an arc structure.

14. The light emitting diode package structure of claim 1, wherein: the wavelength conversion material layer has an optical lens.

15. The light emitting diode package structure of claim 1, wherein: the flip chip electrodes contain Cu or Au and have a thickness of 10 μm-100 μm.

16. A light emitting diode package structure, comprising:
   a first reflecting material layer comprising a reflective glue with through holes;
   an inverted-trapezoidal flip chip on the first reflecting material layer, with electrodes inlaid in the through holes of the first reflecting material layer;

a second reflecting material layer comprising a reflective glue surrounding the inverted-trapezoidal flip chip, wherein an interface between the second reflecting material layer and the flip chip forms an optical cup for upward light reflection of the flip chip; and a wavelength conversion material layer over the first reflecting material layer, the inverted-trapezoidal flip chip, and the second reflecting material layer.

17. The light emitting diode package structure of claim 16, wherein the light emitting diode package structure is manufactured by:

providing a fluorescent film;

bonding a plurality of flip chips to the fluorescent film where the flip chip electrodes are distal from the fluorescent film;

forming a transparent material layer comprising transparent glue on the fluorescent film surrounding a side surface of the flip chip except the electrodes, wherein a side surface of the transparent material layer between adjacent flip chips is in U shape or V shape;

filling the first reflecting material layer on the flip chip and the transparent material layer;

grinding or blasting the first reflecting material layer till the flip chip electrodes are exposed such that the upper surface of the first reflecting material layer is not higher than the upper surface of the flip chip electrodes; and forming a plurality of units by cutting along central lines of adjacent flip chips to obtain a light emitting diode package structure.

* * * * *